(12) United States Patent
Kajiwara et al.

(10) Patent No.: US 10,937,875 B2
(45) Date of Patent: Mar. 2, 2021

(54) SEMICONDUCTOR DEVICE

(71) Applicants: KABUSHIKI KAISHA TOSHIBA, Minato-ku (JP); TOSHIBA ELECTRONIC DEVICES & STORAGE CORPORATION, Minato-ku (JP)

(72) Inventors: Yosuke Kajiwara, Yokohama (JP); Aya Shindome, Yokohama (JP); Masahiko Kuraguchi, Yokohama (JP)

(73) Assignees: KABUSHIKI KAISHA TOSHIBA, Minato-ku (JP); TOSHIBA ELECTRONIC DEVICES & STORAGE CORPORATION, Minato-ku (JP)

( * ) Notice: Subject to any disclaimer, the term of this patent is extended or adjusted under 35 U.S.C. 154(b) by 13 days.

(21) Appl. No.: 16/565,687

(22) Filed: Sep. 10, 2019

(65) Prior Publication Data
US 2020/0135870 A1 Apr. 30, 2020

(30) Foreign Application Priority Data
Oct. 26, 2018 (JP) .............................. JP2018-201521

(51) Int. Cl.
*H01L 29/00* (2006.01)
*H01L 29/417* (2006.01)
(Continued)

(52) U.S. Cl.
CPC .... *H01L 29/41733* (2013.01); *H01L 29/4175* (2013.01); *H01L 29/7827* (2013.01);
(Continued)

(58) Field of Classification Search
CPC ............ H01L 29/41733; H01L 29/7831; H01L 29/7827; H01L 29/4175; H01L 29/41758; H01L 29/7786
See application file for complete search history.

(56) References Cited

U.S. PATENT DOCUMENTS 9,484,421 B2  11/2016  Kajiwara et al.
10,109,715 B2 * 10/2018  Kajiwara .............. H01L 23/535
(Continued)

FOREIGN PATENT DOCUMENTS

JP       62-39074 A      2/1987
JP       2003-258001 A   9/2003
(Continued)

*Primary Examiner* — Nicholas J Tobergte
(74) *Attorney, Agent, or Firm* — Oblon, McClelland, Maier & Neustadt, L.L.P.

(57) ABSTRACT

According to one embodiment, a semiconductor device includes a semiconductor member, drain electrodes, a drain interconnect portion, and a drain conductive portion. The semiconductor member includes first and second semiconductor regions. The drain electrodes extend along a first direction, are arranged in a second direction crossing the first direction, and are provided at the first semiconductor region. A direction from the first semiconductor region toward the second semiconductor region is aligned with the first direction. The drain interconnect portion extends along the second direction and is electrically connected to the drain electrodes. The drain conductive portion is electrically connected to the drain interconnect portion. The drain conductive portion includes first and second conductive regions. A portion of the drain interconnect portion is between the first conductive region and the first semiconductor region in a third direction. The third direction crosses a plane including the first and second directions.

20 Claims, 8 Drawing Sheets

(51) Int. Cl.
*H01L 29/78* (2006.01)
*H01L 29/778* (2006.01)

(52) U.S. Cl.
CPC .... *H01L 29/7831* (2013.01); *H01L 29/41758* (2013.01); *H01L 29/7786* (2013.01)

(56) References Cited

U.S. PATENT DOCUMENTS

| | | | |
|---|---|---|---|
| 10,256,100 B2* | 4/2019 | Hirai | H01L 21/28114 |
| 2002/0011674 A1* | 1/2002 | Efland | H01L 23/4952 |
| | | | 257/762 |
| 2005/0041168 A1* | 2/2005 | Jang | H01L 29/78696 |
| | | | 349/43 |
| 2007/0117355 A1* | 5/2007 | Ueda | H01L 29/0692 |
| | | | 438/478 |
| 2007/0228424 A1* | 10/2007 | Igarashi | H01L 27/0605 |
| | | | 257/256 |
| 2008/0128755 A1* | 6/2008 | Fukamizu | H01L 24/06 |
| | | | 257/203 |
| 2013/0119486 A1* | 5/2013 | Kaibara | H01L 29/2003 |
| | | | 257/411 |
| 2013/0126893 A1* | 5/2013 | Tanaka | H01L 29/66659 |
| | | | 257/76 |
| 2016/0087052 A1 | 3/2016 | Kajiwara et al. | |

FOREIGN PATENT DOCUMENTS

| | | |
|---|---|---|
| JP | 2010-245351 A | 10/2010 |
| JP | 2016-63167 A | 4/2016 |

* cited by examiner

SEMICONDUCTOR DEVICE

CROSS-REFERENCE TO RELATED APPLICATIONS

This application is based upon and claims the benefit of priority from Japanese Patent Application No. 2018-201521, filed on Oct. 26, 2018; the entire contents of which are incorporated herein by reference.

FIELD

Embodiments described herein relate generally to a semiconductor device.

BACKGROUND

For example, there is a semiconductor device that uses a nitride semiconductor. It is desirable to suppress the loss in the semiconductor device.

DETAILED DESCRIPTION

Figure 1A:
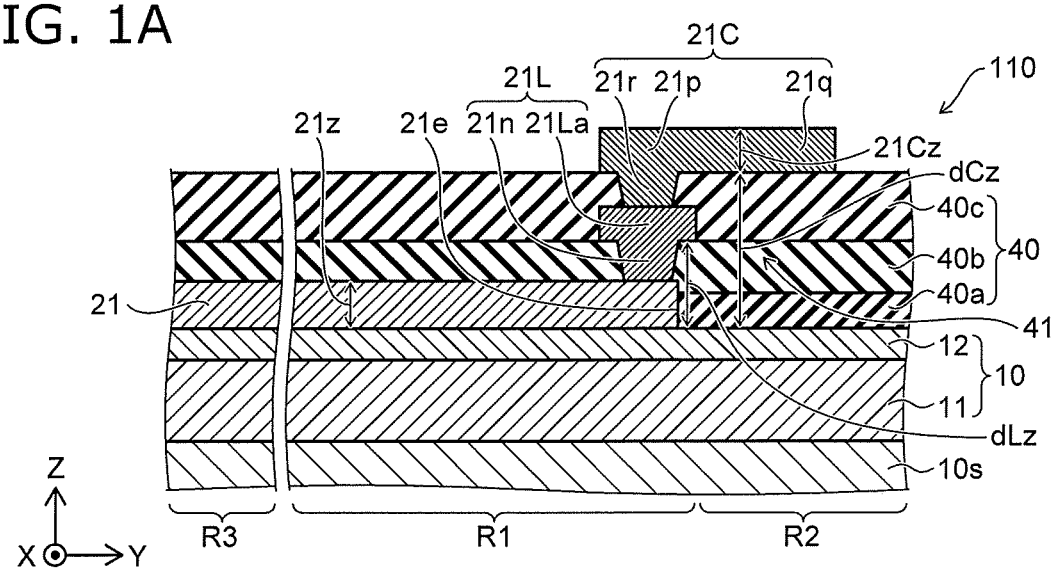
FIG. 1A to FIG. 1C are schematic cross-sectional views illustrating a semiconductor device according to a first embodiment.

According to one embodiment, a semiconductor device includes a semiconductor member, a plurality of drain electrodes, a drain interconnect portion, and a drain conductive portion. The semiconductor member includes a first semiconductor region and a second semiconductor region. The plurality of drain electrodes extends along a first direction, is arranged in a second direction crossing the first direction, and is provided at the first semiconductor region. A direction from the first semiconductor region toward the second semiconductor region is aligned with the first direction. The drain interconnect portion extends along the second direction and is electrically connected to the plurality of drain electrodes. The drain conductive portion is electrically connected to the drain interconnect portion. The drain conductive portion includes a first conductive region and a second conductive region. A portion of the drain interconnect portion is between the first conductive region and the first semiconductor region in a third direction. The third direction crosses a plane including the first direction and the second direction. A direction from the second semiconductor region toward the second conductive region is aligned with the third direction.

According to one embodiment, a semiconductor device includes a semiconductor member, a plurality of drain electrodes, and a drain conductive member. The semiconductor member includes a first semiconductor region and a second semiconductor region. The plurality of drain electrodes extend along a first direction, is arranged in a second direction crossing the first direction, and is provided at the first semiconductor region. A direction from the first semiconductor region toward the second semiconductor region is aligned with the first direction. The drain conductive member includes a drain interconnect portion and a drain conductive portion. The drain interconnect portion extends along the second direction and is electrically connected to the plurality of drain electrodes. A direction from a portion of the plurality of drain electrodes toward the drain interconnect portion is aligned with a third direction. The third direction crosses a plane including the first direction and the second direction. The drain conductive portion is continuous with the drain interconnect portion. A direction from the second semiconductor region toward the drain conductive portion is aligned with the third direction.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

Figure 1B:
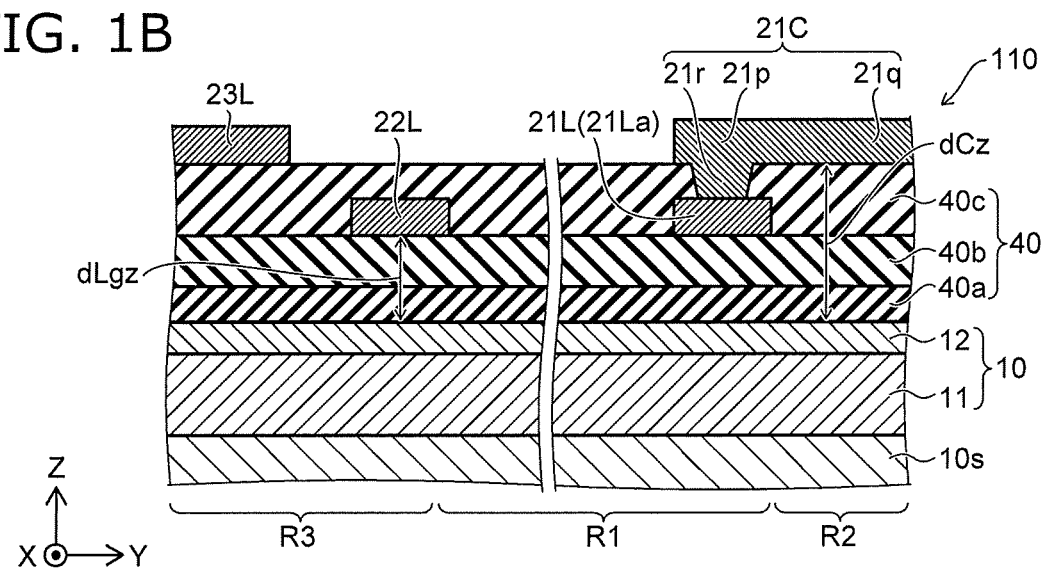
Figure 1C:
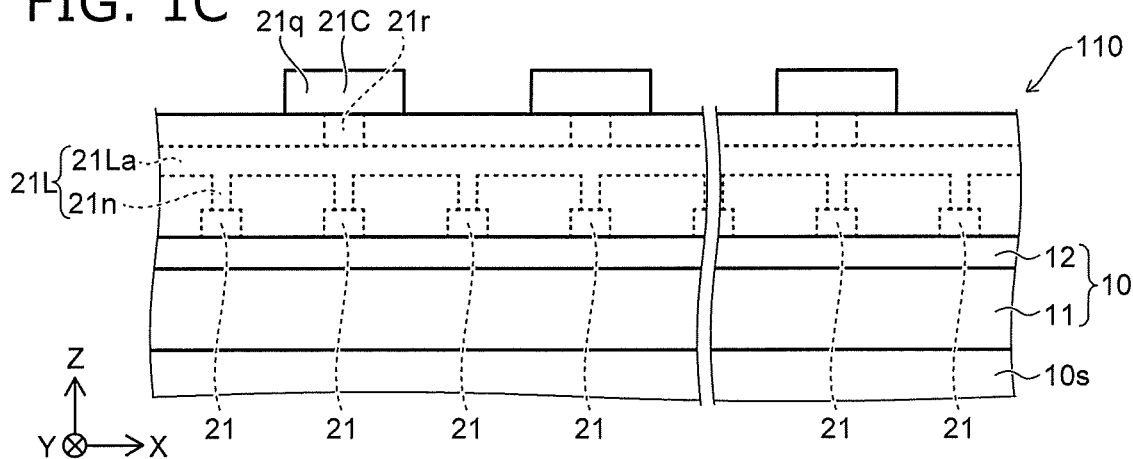

FIG. 1A to FIG. 1C are schematic cross-sectional views illustrating a semiconductor device according to a first embodiment.

Figure 2:
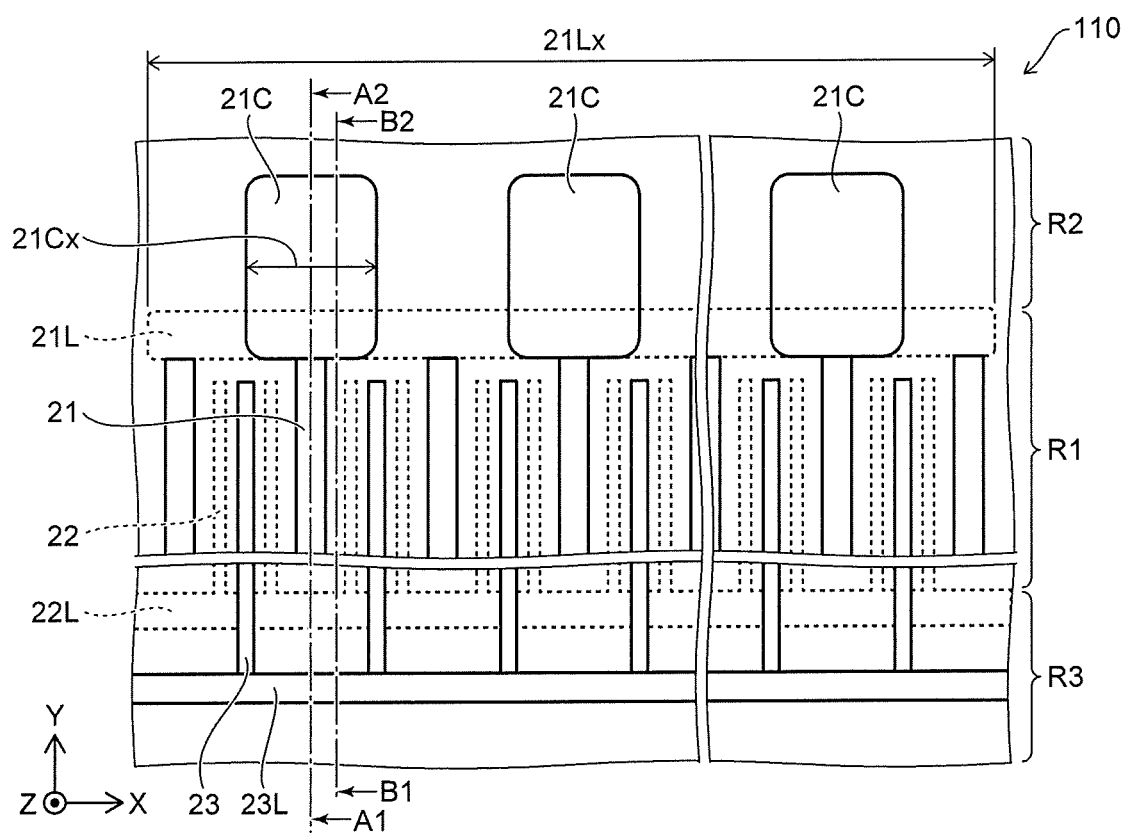
FIG. 2 is a schematic plan view illustrating the semiconductor device according to the first embodiment.

FIG. 2 is a schematic plan view illustrating the semiconductor device according to the first embodiment.

FIG. 1A is a line A1-A2 cross-sectional view of FIG. 2. FIG. 1B is a line B1-B2 cross-sectional view of FIG. 2. FIG. 1C is a see-through side view of the semiconductor device.

As shown in FIG. 1A and FIG. 2, the semiconductor device 110 according to the first embodiment includes a semiconductor member 10, multiple drain electrodes 21, a drain interconnect portion 21L, and a drain conductive portion 21C. The semiconductor device 110 also includes multiple gate electrodes 22, a gate interconnect portion 22L, multiple source electrodes 23, and a source interconnect portion 23L.

The semiconductor member 10 includes a first semiconductor region R1 and a second semiconductor region R2.

The multiple drain electrodes 21 are provided at the first semiconductor region R1. The multiple drain electrodes 21 extend along a first direction. The multiple drain electrodes 21 are arranged in a second direction. The second direction crosses the first direction. The multiple drain electrodes 21 are substantially parallel to each other.

The first direction is taken as a Y-axis direction. The second direction is, for example, an X-axis direction. A direction that crosses a plane including the first direction and the second direction is taken as a third direction. The third direction is, for example, a Z-axis direction.

As shown in FIG. 2, the direction from the first semiconductor region R1 toward the second semiconductor region R2 is aligned with the first direction (the Y-axis direction).

In the example, the semiconductor member 10 further includes a third semiconductor region R3. The first semiconductor region R1 is provided between the third semiconductor region R3 and the second semiconductor region R2.

The first semiconductor region R1 is an element region. The second semiconductor region R2 is a peripheral region (or a connection region) on the drain side. The third semiconductor region R3 is, for example, a peripheral region (or a connection region) on the source side or the gate side.

As shown in FIG. 1A, for example, the semiconductor member 10 is provided on a base body 10s. The base body 10s is, for example, a silicon substrate. The base body 10s may be, for example, a sapphire substrate.

The semiconductor member 10 includes, for example, gallium and nitrogen. In one example, the semiconductor member 10 includes a first semiconductor layer 11 and a second semiconductor layer 12. At least a portion of the second semiconductor layer 12 is provided between the first semiconductor layer 11 and the multiple drain electrodes 21.

The first semiconductor layer 11 includes, for example, $Al_{x1}Ga_{1-x1}N$ ($0 \leq x1 < 1$). The composition ratio x1 may be, for example, not less than 0 and not more than 0.2. The first semiconductor layer 11 may be, for example, a GaN layer.

The second semiconductor layer 12 includes, for example, $Al_{x2}Ga_{1-x2}N$ ($0 < x2 \leq 1$ and $x1 < x2$). The composition ratio x1 may be, for example, not less than 0.1 and not more than 0.35. The second semiconductor layer 12 is, for example, an AlGaN layer. A layer including AlGaN and having a thickness not less than 0.5 nm and not more than 2.0 nm can be provided between the second semiconductor layer 12 and the first semiconductor layer 11.

The multiple drain electrodes 21 are provided on such a semiconductor member 10. The semiconductor device 110 is, for example, a HEMT (High Electron Mobility Transistor).

As shown in FIG. 2, the multiple gate electrodes 22 also are provided at the first semiconductor region R1. The multiple gate electrodes 22 also extend along the first direction (the Y-axis direction). The multiple gate electrodes 22 are substantially parallel to each other.

The multiple source electrodes 23 also are provided at the first semiconductor region R1. The multiple source electrodes 23 also extend along the first direction (the Y-axis direction). The multiple source electrodes 23 are substantially parallel to each other.

For example, one of the multiple gate electrodes 22 is between one of the multiple drain electrodes 21 and another one of the multiple drain electrodes 21.

For example, one of the multiple source electrodes 23 is between one of the multiple drain electrodes 21 and another one of the multiple drain electrodes 21.

For example, one of the multiple gate electrodes 22 is between one of the multiple source electrodes 23 and one of the multiple drain electrodes 21.

As shown in FIG. 2, the gate interconnect portion 22L is electrically connected to the multiple gate electrodes 22. The gate interconnect portion 22L extends along the second direction (e.g., the X-axis direction). The direction from the third semiconductor region R3 toward the gate interconnect portion 22L is aligned with the Z-axis direction (e.g., the third direction). For example, the gate interconnect portion 22L is provided above the third semiconductor region R3.

As shown in FIG. 2, the source interconnect portion 23L is electrically connected to the multiple source electrodes 23. The source interconnect portion 23L extends along the second direction (e.g., the X-axis direction). The direction from the third semiconductor region R3 toward the source interconnect portion 23L is aligned with the Z-axis direction (e.g., the third direction). For example, the source interconnect portion 23L is provided above the third semiconductor region R3.

As shown in FIG. 2, the gate interconnect portion 22L and the source interconnect portion 23L have stripe configurations extending along the X-axis direction.

In the semiconductor device 110, for example, a gate pad electrode that is linked to the gate interconnect portion 22L may be provided. For example, a source pad electrode that is linked to the source interconnect portion 23L may be provided.

As shown in FIG. 2, the drain interconnect portion 21L is electrically connected to the multiple drain electrodes 21. The drain interconnect portion 21L extends along the second direction (e.g., the X-axis direction). For example, the drain interconnect portion 21L has a stripe configuration extending along the second direction.

The drain conductive portion 21C is electrically connected to the drain interconnect portion 21L.

As shown in FIG. 1A, the drain conductive portion 21C includes a first conductive region 21p and a second conductive region 21q. The second conductive region 21q is continuous with the first conductive region 21p. In the example, the drain conductive portion 21C further includes a third conductive region 21r. The third conductive region 21r is continuous with the first conductive region 21p.

A portion of the drain interconnect portion 21L is between the first conductive region 21p and the first semiconductor region R1 in the third direction (a direction, e.g., the Z-axis direction crossing a plane including the first direction and the second direction).

On the other hand, the direction from the second semiconductor region R2 toward the second conductive region 21q is aligned with the third direction (e.g., the Z-axis direction). The drain interconnect portion 21L is not provided between the second semiconductor region R2 and the second conductive region 21q in the third direction (e.g., the Z-axis direction).

As shown in FIG. 1A and FIG. 2, the drain conductive portion 21C overlaps a portion of the drain interconnect portion 21L in the third direction (e.g., the Z-axis direction).

The third conductive region 21r of the drain conductive portion 21C is provided between the first conductive region 21p and the drain interconnect portion 21L. The third conductive region 21r electrically connects the first conductive region 21p to the drain interconnect portion 21L. The third conductive region 21r is, for example, a via conductive portion.

FIG. 1C is a see-through side view of the semiconductor device 110 when viewed from the first direction (the Y-axis direction (the right side of FIG. 1A and the upper side of FIG. 2)). As shown in FIG. 1A and FIG. 1C, for example, the drain interconnect portion 21L includes a second-direction extension portion 21La and a connection portion 21n. The second-direction extension portion 21La extends along the second direction (the X-axis direction). The connection portion 21n electrically connects the second-direction extension portion 21La and one of the multiple drain electrodes.

For example, the connection portion 21n extends along the Z-axis direction. The connection portion 21n is, for example, a via conductive portion.

The drain interconnect portion 21L is, for example, a connection interconnect electrically connecting the multiple drain electrodes 21. On the other hand, the drain conductive portion 21C is, for example, a pad electrode.

To function as a pad electrode, the length (the width) in the Y-axis direction of the drain conductive portion 21C is set to be not less than some amount. Here, a reference example may be considered in which the drain conductive portion 21C is provided along the drain interconnect portion 21L for the entire drain interconnect portion 21L. In the reference example, the electrostatic capacitance between the drain conductive portion 21C and the second semiconductor region R2 is large. The electrostatic capacitance is, for example, a drain-source capacitance Cds. The switching loss is large when the drain-source capacitance Cds is large.

Conversely, in the embodiment, the drain conductive portion 21C is provided at a portion of the drain interconnect portion 21L. Therefore, the drain-source capacitance Cds is small. Thereby, for example, the switching loss can be suppressed. According to the embodiment, a semiconductor device can be provided in which the loss can be suppressed.

As shown in FIG. 2, a length 21Cx along the second direction (e.g., the X-axis direction) of the drain conductive portion 21C is shorter than a length 21Lx along the second direction of the drain interconnect portion 21L.

As shown in FIG. 2, multiple drain conductive portions 21C may be provided. The length along the second direction (e.g., the X-axis direction) of one of the multiple drain conductive portions 21C is the length 21Cx. The total of the lengths 21Cx of the multiple drain conductive portions 21C (the product of the length 21Cx and a number N of the multiple drain conductive portions 21C) is shorter than the length 21Lx along the second direction of the drain interconnect portion 21L. The total of the lengths 21Cx may be, for example, not more than ½ of the length 21Lx. The length 21Cx may be, for example, not more than ⅕ of the length 21Lx. By setting the drain conductive portion 21C to be small, the drain-source capacitance Cds can be small. The length 21Cx is greater than 0.

As shown in FIG. 1A, the distance along the third direction (e.g., the Z-axis direction) between the semiconductor member 10 and the second conductive region 21q is taken as a distance dCz. On the other hand, the distance along the third direction between the semiconductor member 10 and the second-direction extension portion 21La is taken as a distance dLz. The distance dCz is longer than the distance dLz. By setting the distance dCz to be long, the drain-source capacitance Cds can be small.

The distance dCz is longer than the distance along the third direction between the semiconductor member 10 and the multiple drain electrodes 21 (which may be, for example, substantially 0).

As shown in FIG. 1A, end portions 21e of the multiple drain electrodes 21 may be between the drain interconnect portion 21L and the first semiconductor region R1 in the third direction (e.g., the Z-axis direction).

As shown in FIG. 1A, the semiconductor device 110 may further include an insulating portion 40. In the example, the insulating portion 40 includes insulating regions 40a, 40b, and 40c. The boundaries between these insulating regions may be indistinct. The insulating portion 40 includes an insulating region 41. The insulating region 41 is between the second semiconductor region R2 and the second conductive region 21q in the third direction (the Z-axis direction). The insulating region 41 contacts the second semiconductor region R2 and the second conductive region 21q. The distance dCz recited above corresponds to the thickness along the Z-axis direction of the insulating region 41.

As shown in FIG. 1B, the distance dCz along the third direction (e.g., the Z-axis direction) between the semiconductor member 10 and the second conductive region 21q is longer than the distance dLgz along the third direction between the semiconductor member 10 and the gate interconnect portion 22L. For example, the height of the second conductive region 21q referenced to the semiconductor member 10 is higher than the height of the gate interconnect portion 22L referenced to the semiconductor member 10.

In the example, the gate interconnect portion 22L and the drain interconnect portion 21L are in substantially the same layer. For example, the direction from the gate interconnect portion 22L toward the drain interconnect portion 21L is aligned with the first direction (the Y-axis direction). The source interconnect portion 23L and the drain conductive portion 21C are in substantially the same layer. For example, the direction from the source interconnect portion 23L toward the drain conductive portion 21C is aligned with the first direction (the Y-axis direction).

As described below, the source interconnect portion 23L and the drain interconnect portion 21L may be in the same layer.

As shown in FIG. 2, multiple drain conductive portions 21C may be provided. The number of the multiple drain conductive portions 21C is the number N. The number of the multiple drain electrodes 21 is taken as a number n. The number n is larger than the number N. For example, the number n is not less than 4 times and not more than 20 times the number N.

As shown in FIG. 1A, the length along the third direction (e.g., the Z-axis direction) of the second conductive region 21q of the drain conductive portion 21C is taken as a length 21Cz. The length 21Cz corresponds to the thickness of the second conductive region 21q. In one example, the length 21Cz is, for example, not less than 500 nm and not more than 3000 nm.

The length along the third direction (e.g., the Z-axis direction) of one of the multiple drain electrodes 21 is taken as a length 21z. The length 21z corresponds to the thickness of the one of the multiple drain electrodes 21. In one example, the length 21z is, for example, not less than 200 nm and not more than 500 nm.

Figure 3:
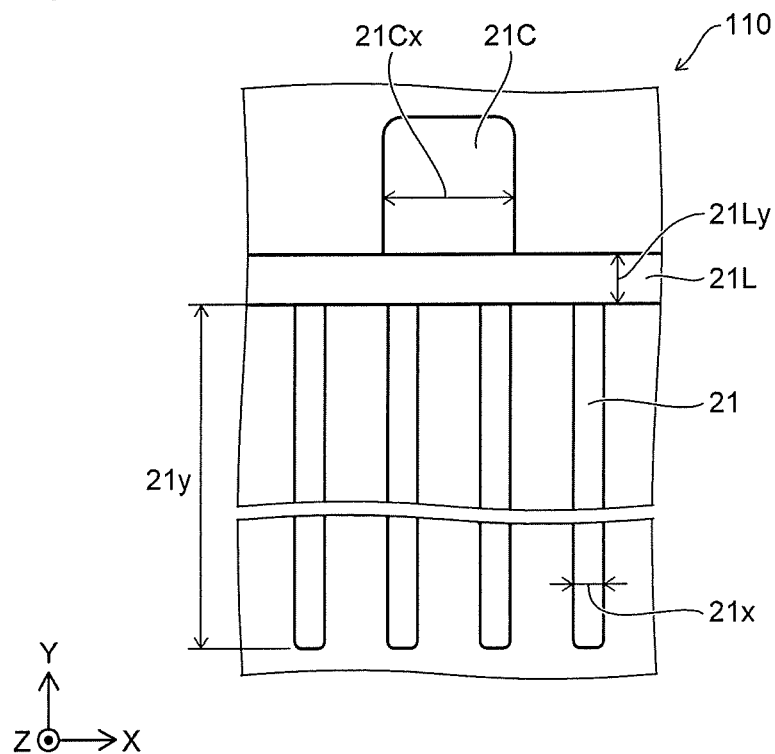
FIG. 3 is a schematic plan view illustrating the semiconductor device according to the first embodiment.

FIG. 3 is a schematic plan view illustrating the semiconductor device according to the first embodiment.

As shown in FIG. 3, the length along the second direction (e.g., the X-axis direction) of one of the multiple drain electrodes 21 is taken as a length 21x. The length 21x corresponds to the width of the one of the multiple drain electrodes 21. The length along the first direction (e.g., the Y-axis direction) of the one of the multiple drain electrodes 21 is taken as a length 21y. The length 21y is longer than the length 21x.

The length along the first direction (the Y-axis direction) of the drain interconnect portion 21L is taken as a length 21Ly. The length 21Ly corresponds to the width of the drain interconnect portion 21L. The length 21Ly is longer than the length 21x (the length along the second direction (the X-axis direction) of one of the multiple drain electrodes 21).

The length 21Ly may be, for example, substantially the product of the length 21x and the ratio (n/N). For example, the length 21Ly may be, for example, not less than 0.5 times and not more than 2 times the product of the length 21x and the ratio (n/N).

For example, the current density of the drain interconnect portion 21L is substantially the same as the current density of the drain electrodes 21. A locally-high current density is suppressed. For example, the temperature increase can be suppressed. For example, higher reliability is obtained easily.

The product of the number (the number N) of the multiple drain conductive portions 21C, the length 21Cz (the thickness referring to FIG. 1A) along the third direction (e.g., the Z-axis direction) of the second conductive region 21q, and the length 21Cx (the width referring to FIG. 3) along the second direction (e.g., the X-axis direction) of one of the multiple drain conductive portions 21C is taken as a first product. The product of the number n of the multiple drain electrodes 21, the length 21z (the thickness referring to FIG. 1A) along the third direction of one of the multiple drain electrodes 21, and the length 21x (the width referring to FIG. 3) along the second direction (e.g., the X-axis direction) of the one of the multiple drain electrodes 21 is taken as a second product. The first product is substantially the same as the second product. For example, the first product may be not less than 0.5 times and not more than 2 times the second product.

For example, the current density of the multiple drain conductive portions 21C is substantially the same as the current density of the drain electrodes 21. A locally-high current density is suppressed. For example, the temperature increase can be suppressed. For example, higher reliability is obtained easily.

In the semiconductor device 110 as shown in FIG. 1A and FIG. 1C, one of the multiple drain electrodes 21 is between the third conductive region 21r of the drain conductive portion 21C and the semiconductor member 10 in the Z-axis direction.

Figure 4:
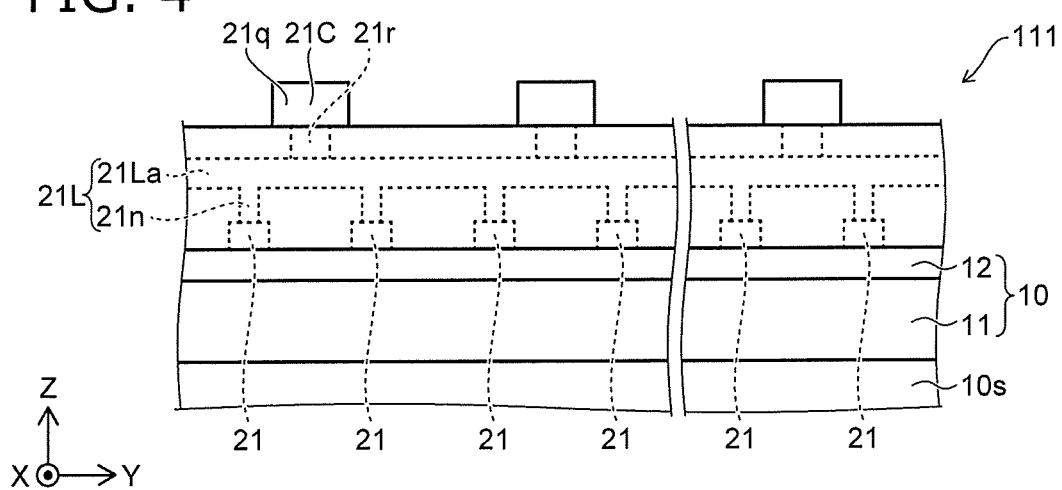
FIG. 4 is a see-through side view illustrating a semiconductor device according to the first embodiment.

FIG. 4 is a see-through side view illustrating a semiconductor device according to the first embodiment.

As shown in FIG. 4, the semiconductor device 111 also includes the semiconductor member 10, the multiple drain electrodes 21, the drain interconnect portion 21L, and the drain conductive portion 21C. The semiconductor device 111 also may include the multiple gate electrodes 22, the gate interconnect portion 22L, the multiple source electrodes 23, the source interconnect portion 23L, etc. (not illustrated in FIG. 4). The relationship between the position of the third conductive region 21r of the drain conductive portion 21C and the positions of the multiple drain electrodes 21 of the semiconductor device 111 is different from that of the semiconductor device 110. Otherwise, the configuration of the semiconductor device 111 is similar to the configuration of the semiconductor device 110.

In the semiconductor device 111, not one of the multiple drain electrodes 21 is between the semiconductor member 10 and the third conductive region 21r of the drain conductive portion 21C in the Z-axis direction. One of the multiple drain electrodes is between the drain interconnect portion 21L and the semiconductor member 10 in the Z-axis direction. In the semiconductor device 111, one of the multiple drain electrodes 21 may overlap a portion of the drain conductive portion 21C in the Z-axis direction.

In the semiconductor device 111 as well, the drain-source capacitance Cds can be small. Thereby, for example, the switching loss can be suppressed. For example, a semiconductor device can be provided in which the loss can be suppressed.

Figure 5:
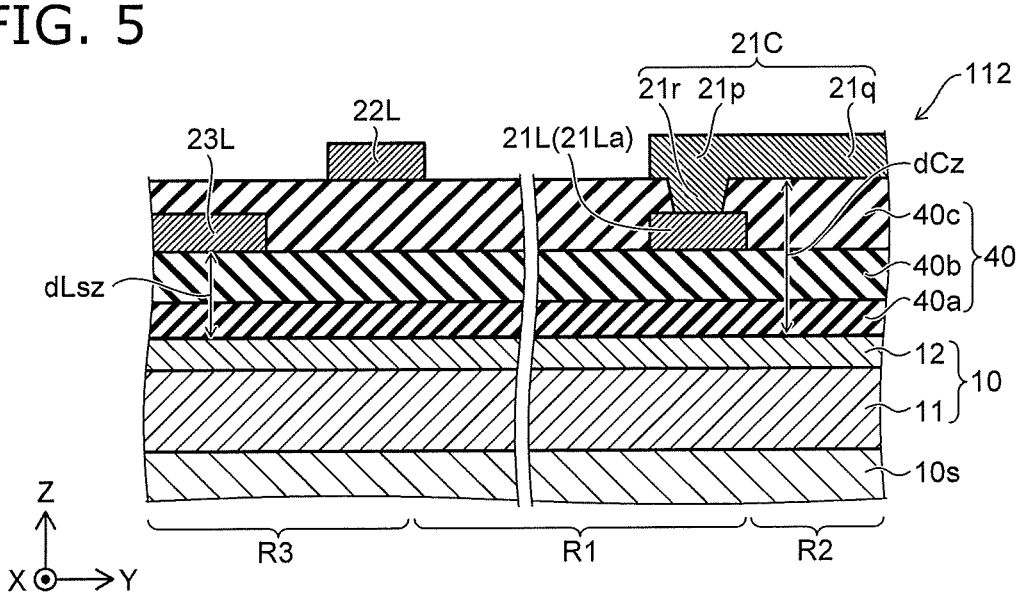
FIG. 5 is a schematic cross-sectional view illustrating a semiconductor device according to the first embodiment.

FIG. 5 is a schematic cross-sectional view illustrating a semiconductor device according to the first embodiment.

FIG. 5 is a schematic cross-sectional view corresponding to FIG. 1B. As shown in FIG. 5, the relationship between the height of the source interconnect portion 23L and the height of the gate interconnect portion 22L of the semiconductor device 112 is different from that of the semiconductor device 110 (referring to FIG. 1B). Otherwise, the configuration of the semiconductor device 112 is similar to the configuration of the semiconductor device 110.

The source interconnect portion 23L is provided in the semiconductor device 112. As described above, the source interconnect portion 23L is electrically connected to the multiple source electrodes 23 and extends along the second direction (e.g., the X-axis direction) (referring to FIG. 2). As described above, the multiple source electrodes 23 are provided at the first semiconductor region R1 and extend along the first direction (the Y-axis direction). One of the multiple source electrodes 23 is between one of the multiple drain electrodes 21 and another one of the multiple drain electrodes 21.

As shown in FIG. 5, for example, the height of the second conductive region 21q referenced to the semiconductor member 10 is higher than the height of the source interconnect portion 23L referenced to the semiconductor member 10.

For example, as described above, the distance along the third direction (e.g., the Z-axis direction) between the semiconductor member 10 and the second conductive region 21q is the distance dCz. The distance along the third direction between the semiconductor member 10 and the source interconnect portion 23L is taken as a distance dLsz. The distance dCz is longer than the distance dLsz. The drain-source capacitance Cds can be small.

In the example, the source interconnect portion 23L and the drain interconnect portion 21L are in the same layer. For example, the direction from the source interconnect portion 23L toward the drain interconnect portion 21L is aligned with the first direction (the Y-axis direction). In the example, the gate interconnect portion 22L and the drain conductive portion 21C are in the same layer. For example, the direction from the gate interconnect portion 22L toward the drain conductive portion 21C is aligned with the first direction (the Y-axis direction).

Figure 6:
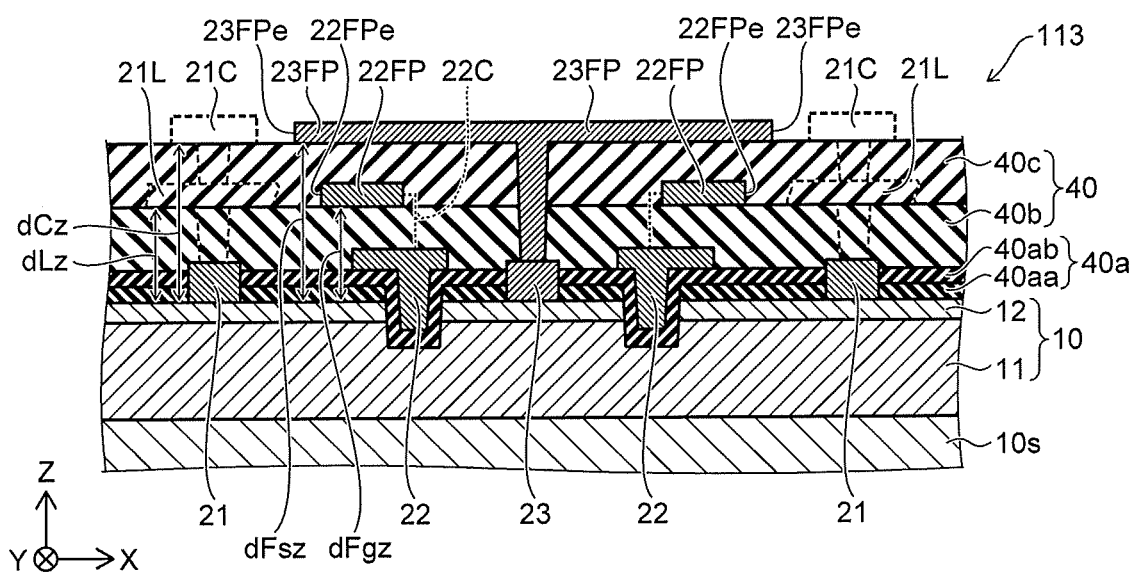
FIG. 6 is a schematic cross-sectional view illustrating a semiconductor device according to the first embodiment.

FIG. 6 is a schematic cross-sectional view illustrating a semiconductor device according to the first embodiment.

As shown in FIG. 6, a gate conductive member 22FP is further provided in the semiconductor device 113. A source conductive member 23FP is further provided in the semiconductor device 113. Otherwise, the configuration of the semiconductor device 113 is similar to the configuration of the semiconductor device 110.

Examples of the gate conductive member 22FP and the source conductive member 23FP will now be described.

In the semiconductor device 113 as well, the multiple drain electrodes 21, the drain interconnect portion 21L, the drain conductive portion 21C, the multiple source electrodes 23, the source interconnect portion 23L, the multiple gate electrodes 22, and the gate interconnect portion 22L are provided (referring to FIG. 2). As described above, the multiple source electrodes 23 are provided at the first semiconductor region R1 and extend along the first direction (the Y-axis direction). The source interconnect portion 23L is electrically connected to the multiple source electrodes 23 and extends along the second direction (e.g., the X-axis direction). The multiple gate electrodes 22 are provided at the first semiconductor region R1 and extend along the first direction. The gate interconnect portion 22L is electrically connected to the multiple gate electrodes 22 and extends along the second direction.

As shown in FIG. 6, the gate conductive member 22FP is electrically connected to one of the multiple gate electrodes 22. The electrical connection between the gate conductive member 22FP and the one of the multiple gate electrodes 22 is shown by a broken line 22C (a conductive member) in FIG. 6. The conductive member is not illustrated in the cross-sectional view of FIG. 6. In the embodiment, the gate conductive member 22FP may be electrically connected to one of the multiple source electrodes 23 without being electrically connected to one of the multiple gate electrodes 22.

As shown in FIG. 6, one of the multiple gate electrodes 22 is between one of the multiple source electrodes 23 and one of the multiple drain electrodes 21.

The position in the second direction (the X-axis direction) of an end portion 22FPe of the gate conductive member 22FP is between the position in the second direction (the X-axis direction) of the one of the multiple gate electrodes 22 recited above and the position in the second direction (the X-axis direction) of the one of the multiple drain electrodes 21 recited above. The gate conductive member 22FP is, for example, a gate field plate.

As described above, the distance along the third direction (e.g., the Z-axis direction) between the semiconductor member 10 and the drain interconnect portion 21L is taken as the distance dLz (referring to FIG. 1A and FIG. 6). The distance along the third direction between the semiconductor member 10 and the gate conductive member 22FP is taken as a distance dFgz (referring to FIG. 6). The distance dLz is substantially the same as the distance dFgz. For example, the drain interconnect portion 21L and the gate conductive member 22FP are in substantially the same layer.

For example, the material of the drain interconnect portion 21L may be the same as the material of the gate conductive member 22FP.

As shown in FIG. 6, the source conductive member 23FP is electrically connected to one of the multiple source electrodes 23. For example, the multiple drain conductive portions 21C may not overlap the source conductive member 23FP in the X-axis direction.

For example, the position in the second direction (the X-axis direction) of an end portion 23FPe of the source conductive member 23FP is between the position in the second direction of the one of the multiple gate electrodes 22 recited above and the position in the second direction of the one of the multiple drain electrodes 21 recited above. The source conductive member 23FP is, for example, a source field plate.

As described above, the distance along the third direction (e.g., the Z-axis direction) between the semiconductor member 10 and the second conductive region 21q is taken as the distance dCz (referring to FIG. 1A and FIG. 6). The distance along the third direction between the semiconductor member 10 and the source conductive member 23FP is taken as a distance dFsz (referring to FIG. 6). The distance dCz is substantially the same as the distance dFsz. For example, the second conductive region 21q and the source conductive member 23FP are in substantially the same layer.

In the embodiment, for example, the material of the second conductive region 21q (the drain conductive portion 21C) may be the same as the material of the source conductive member 23FP.

As shown in FIG. 6, insulating films 40aa and 40ab are provided in the example. The insulating film 40aa is, for example, a protective film. The insulating film 40ab is, for example, a gate insulating film. The insulating film 40aa includes, for example, silicon and nitrogen. The insulating film 40ab includes, for example, silicon and oxygen.

Second Embodiment

Figure 7A:
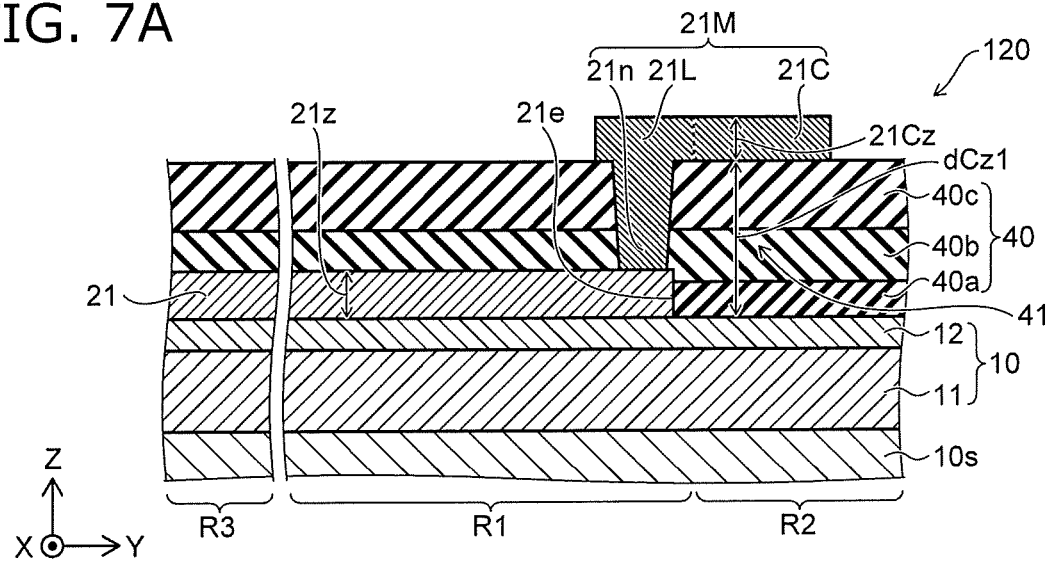
FIG. 7A to FIG. 7C are schematic cross-sectional views illustrating a semiconductor device according to a second embodiment.
Figure 7B:
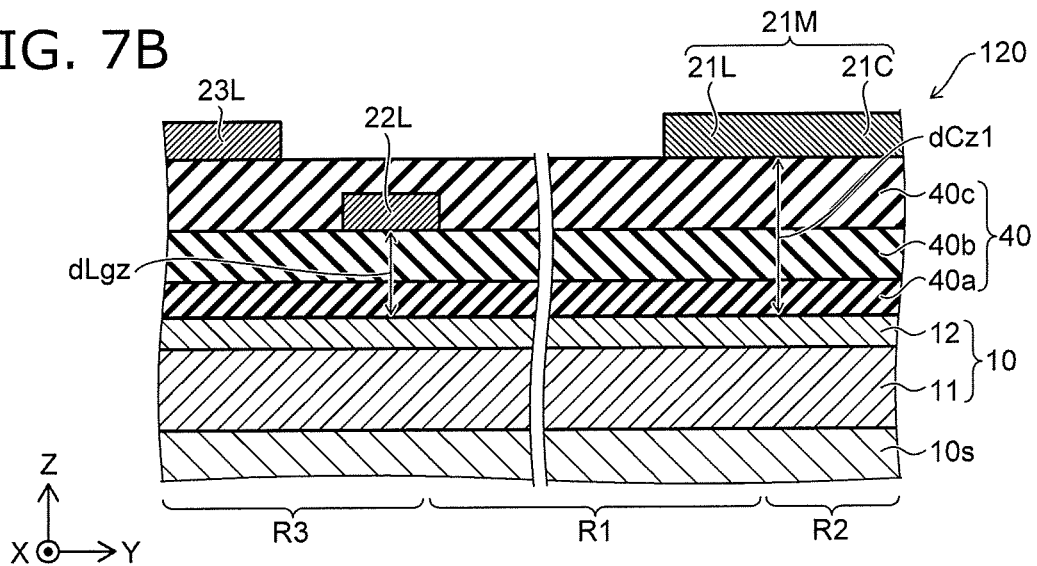
Figure 7C:
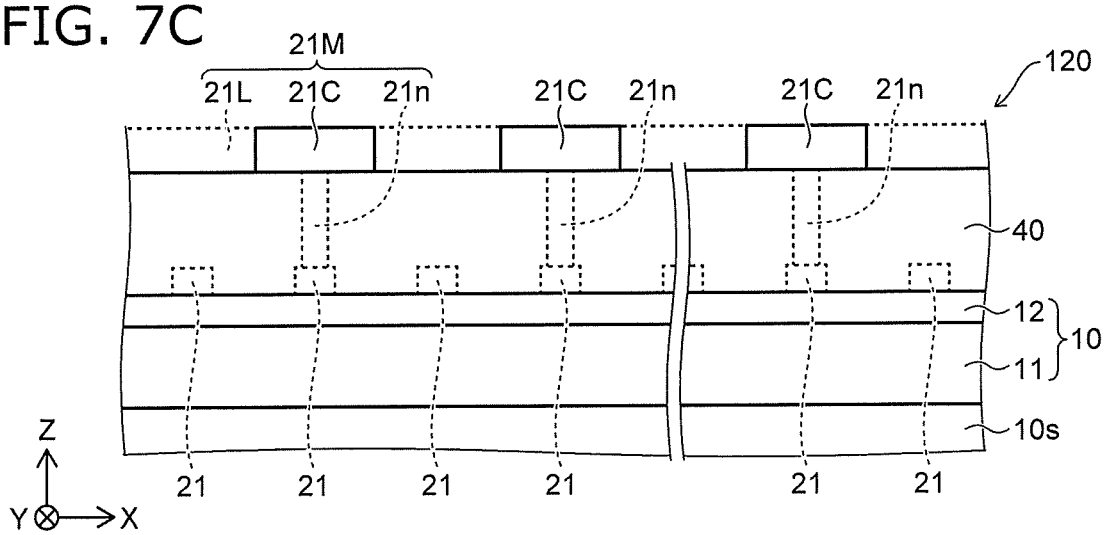

FIG. 7A to FIG. 7C are schematic cross-sectional views illustrating a semiconductor device according to a second embodiment.

Figure 8:
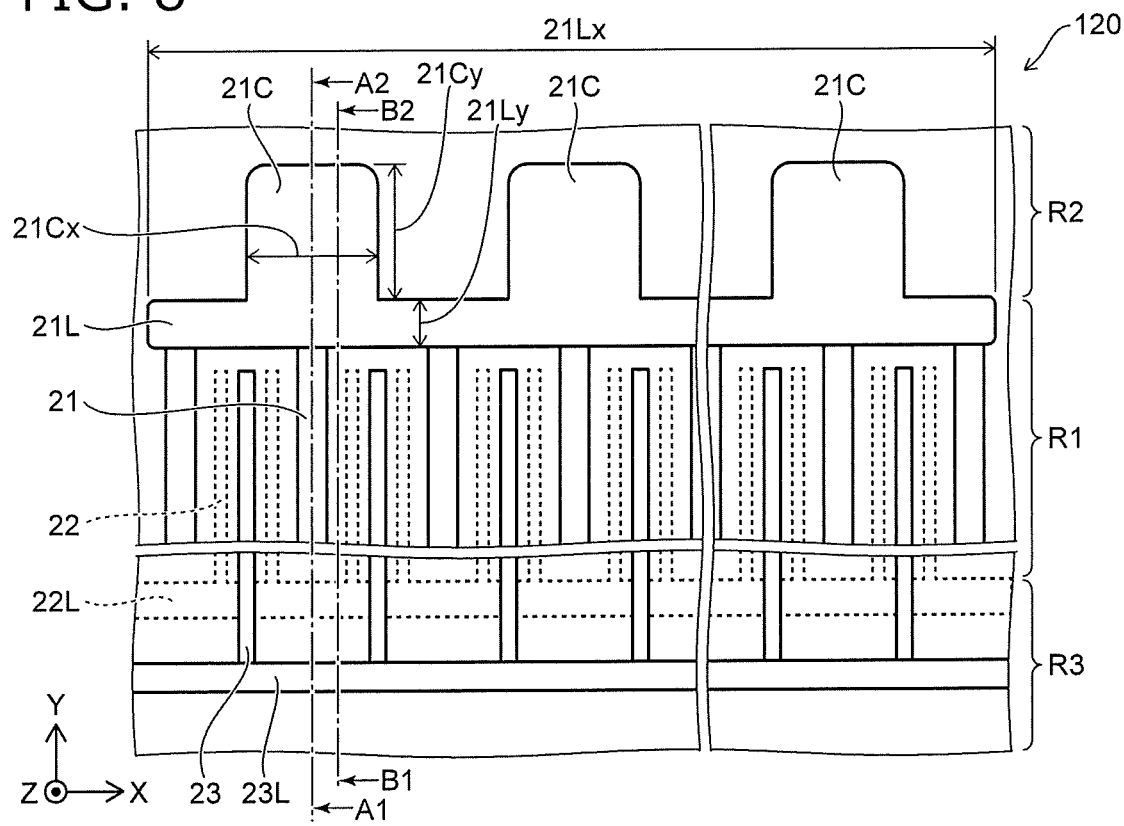
FIG. 8 is a schematic plan view illustrating the semiconductor device according to the second embodiment.

FIG. 8 is a schematic plan view illustrating the semiconductor device according to the second embodiment.

FIG. 7A is a line A1-A2 cross-sectional view of FIG. 8. FIG. 7B is a line B1-B2 cross-sectional view of FIG. 8. FIG. 7C is a see-through side view of the semiconductor device.

As shown in FIG. 7A and FIG. 8, the semiconductor device 120 according to the second embodiment includes the semiconductor member 10, the multiple drain electrodes 21, and a drain conductive member 21M. The semiconductor device 120 also includes the multiple gate electrodes 22, the gate interconnect portion 22L, the multiple source electrodes 23, and the source interconnect portion 23L. The semiconductor member 10, the multiple gate electrodes 22, the gate interconnect portion 22L, the multiple source electrodes 23, and the source interconnect portion 23L of the semiconductor device 120 are similar to those of the semiconductor device 110; and a description is therefore omitted.

In the semiconductor device 120 as well, the semiconductor member 10 includes the first semiconductor region R1 and the second semiconductor region R2. In the example, the semiconductor member 10 further includes the third semiconductor region R3.

As shown in FIG. 8, in the semiconductor device 120 as well, the multiple drain electrodes 21 are provided at the first semiconductor region R1. The multiple drain electrodes 21 extend along the first direction (the Y-axis direction). The multiple drain electrodes 21 are arranged in the second direction (e.g., the X-axis direction) crossing the first direction. As described above, the direction from the first semiconductor region R1 toward the second semiconductor region R2 is aligned with the first direction.

The drain conductive member 21M is electrically connected to the multiple drain electrodes 21. The drain conductive member 21M includes the drain interconnect portion 21L and the drain conductive portion 21C.

The drain interconnect portion 21L is electrically connected to the multiple drain electrodes 21. The drain interconnect portion 21L extends along the second direction (e.g., the X-axis direction).

The direction from portions (e.g., the end portions 21e) of the multiple drain electrodes 21 toward the drain interconnect portion 21L is aligned with the third direction. The third direction crosses a plane including the first direction and the second direction. The third direction is, for example, the Z-axis direction.

The drain conductive portion 21C is continuous with the drain interconnect portion 21L. The direction from the second semiconductor region R2 toward the drain conductive portion 21C is aligned with the third direction (e.g., the Z-axis direction).

In the example, the drain conductive member 21M includes the connection portion 21n. The connection portion 21n electrically connects the drain interconnect portion 21L to each of the multiple drain electrodes 21. The connection portion 21n is, for example, a via conductive portion.

For example, the direction from the drain interconnect portion 21L toward the drain conductive portion 21C is aligned with the first direction (the Y-axis direction). The drain conductive portion 21C is provided at a portion of the drain interconnect portion 21L.

In the semiconductor device 120 as well, the distance (the distance dCz1 referring to FIG. 7A) between the drain conductive portion 21C and the semiconductor member 10 is long. The drain-source capacitance Cds can be small. Thereby, for example, the switching loss can be suppressed. According to the embodiment, a semiconductor device can be provided in which the loss can be suppressed.

As shown in FIG. 8, the length 21Cx along the second direction (e.g., the X-axis direction) of the drain conductive portion 21C is shorter than the length 21Lx along the second direction of the drain interconnect portion 21L.

As shown in FIG. 8, multiple drain conductive portions 21C may be provided. The length along the second direction (the X-axis direction) of one of the multiple drain conductive portions 21C is the length 21Cx. The total of the lengths 21Cx of the multiple drain conductive portions 21C (the product of the length 21Cx and the number N of the multiple drain conductive portions 21C) is shorter than the length 21Lx along the second direction of the drain interconnect portion 21L. By setting the size of the drain conductive portion 21C to be small, the drain-source capacitance Cds can be small; and the switching loss can be suppressed.

In one example, the product of the length 21Cx and the number N of the multiple drain conductive portions 21C is, for example, not more than ½ of the length 21Lx. The product may be, for example, not more than ⅕ of the length 21Lx.

The length 21Cx along the second direction (the X-axis direction) of the drain conductive portion 21C may change in the Y-axis direction. In such a case, for example, the average value of the changing length can be used as the length 21Cx.

In the drain conductive member 21M, the width in the Y-axis direction of the drain interconnect portion 21L is substantially constant. For example, in the drain conductive member 21M, the boundary between the drain interconnect portion 21L and the drain conductive portion 21C can be defined as the position (the flexion point) where the width in the Y-axis direction changes abruptly.

In one example according to the semiconductor device 120, a length 21Cy along the first direction (the Y-axis direction) of the drain conductive portion 21C is longer than the length 21Ly along the first direction (the Y-axis direction) of the drain interconnect portion 21L (referring to FIG. 8). By setting the length 21Cy (the width) to be longer than the length 21Ly (the width), for example, the electrical connection is easy when using the drain conductive portion 21C as a pad electrode. On the other hand, the drain-source capacitance Cds can be small because the length 21Ly is short.

As shown in FIG. 7A, the semiconductor device 120 includes the insulating portion 40. The insulating portion 40 includes the insulating region 41. The insulating region 41 is provided between the second semiconductor region R2 and the drain conductive portion 21C in the third direction (e.g., the Z-axis direction). The insulating region 41 contacts the second semiconductor region R2 and the drain conductive portion 21C.

As shown in FIG. 7B, the distance dCz1 along the third direction (e.g., the Z-axis direction) between the semiconductor member 10 and the drain conductive portion 21C may be longer than the distance dLgz along the third direction between the semiconductor member 10 and the gate interconnect portion 22L. For example, the height of the drain conductive portion 21C referenced to the semiconductor member 10 is higher than the height of the gate interconnect portion 22L referenced to the semiconductor member 10.

In the example as shown in FIG. 7B, the source interconnect portion 23L and the drain interconnect portion 21L (or the drain conductive portion 21C) are in substantially the same layer. For example, the direction from the source interconnect portion 23L toward the drain interconnect portion 21L (or the drain conductive portion 21C) is aligned with the first direction (the Y-axis direction). The gate interconnect portion 22L and the drain interconnect portion 21L (or the drain conductive portion 21C) may be in the same layer (e.g., referring to FIG. 5).

In the semiconductor device 120 as shown in FIG. 7C, one of the multiple drain electrodes 21 is between the drain conductive portion 21C and the semiconductor member 10 in the Z-axis direction. One of the multiple drain electrodes 21 may not be between the drain conductive portion 21C and the semiconductor member 10 in the Z-axis direction. One of the multiple drain electrodes 21 is between the drain interconnect portion 21L and the semiconductor member 10 in the Z-axis direction.

As shown in FIG. 8, multiple drain conductive portions 21C may be provided. For example, the number n of the multiple drain electrodes 21 is not less than 4 times and not more than 20 times the number N of the multiple drain conductive portions 21C.

For example, the product of the number (the number N) of the multiple drain conductive portions 21C, the length 21Cz (the thickness referring to FIG. 7A) along the third direction (e.g., the Z-axis direction) of the second conductive region 21q, and the length 21Cx (the width referring to FIG. 3) along the second direction (e.g., the X-axis direction) of one of the multiple drain conductive portions 21C is taken as the first product. The product of the number n of the multiple drain electrodes 21, the length 21z (the thickness referring to FIG. 7A) along the third direction of one of the multiple drain electrodes 21, and the length 21x (the width referring to FIG. 3) along the second direction (e.g., the X-axis direction) of the one of the multiple drain electrodes 21 is taken as the second product. The first product is substantially the same as the second product. For example, the first product may be not less than 0.5 times and not more than 2 times the second product. A locally-high current density is suppressed. For example, the temperature increase can be suppressed. For example, higher reliability is obtained easily.

As shown in FIG. 8, the length along the second direction (the X-axis direction) of one of the multiple drain electrodes 21 is taken as the length 21x. On the other hand, the length along the first direction (the Y-axis direction) of the drain interconnect portion 21L is taken as the length 21Ly. The length 21Ly corresponds to the width of the drain interconnect portion 21L. The length 21Ly is longer than the length 21x. For example, the current density of the drain interconnect portion 21L is substantially the same as the current density of the drain electrodes 21. A locally-high current density is suppressed. For example, the temperature increase can be suppressed. For example, higher reliability is obtained easily.

Figure 9:
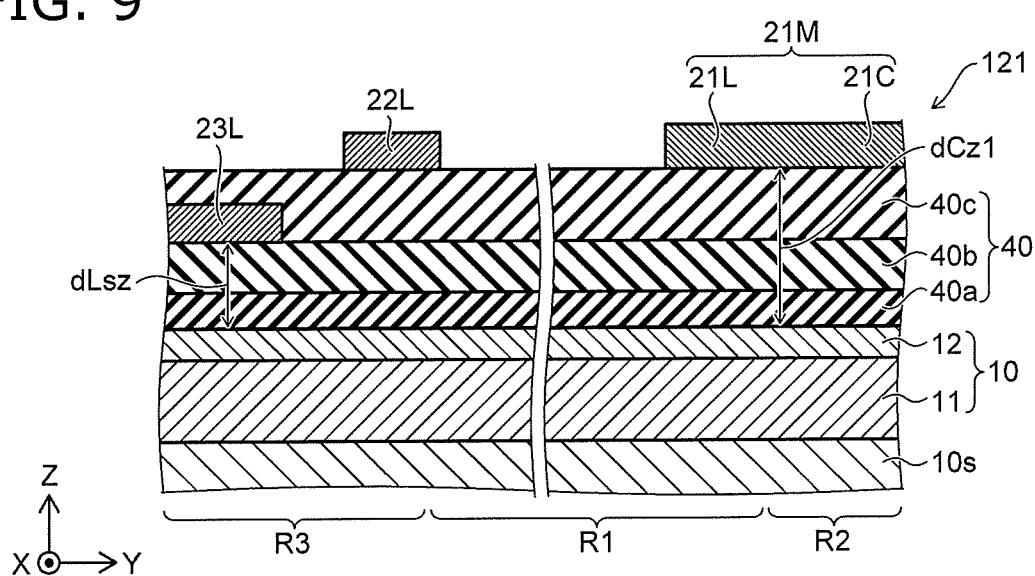
FIG. 9 is a schematic cross-sectional view illustrating a semiconductor device according to the second embodiment.

FIG. 9 is a schematic cross-sectional view illustrating a semiconductor device according to the second embodiment.

FIG. 9 is a schematic cross-sectional view corresponding to FIG. 7B. As shown in FIG. 9, the relationship between the height of the source interconnect portion 23L and the height of the gate interconnect portion 22L of the semiconductor device 121 is different from that of the semiconductor device 120 (referring to FIG. 7B). Otherwise, the configuration of the semiconductor device 121 is similar to the configuration of the semiconductor device 110.

The distance along the third direction (e.g., the Z-axis direction) between the semiconductor member 10 and the drain conductive portion 21C is the distance dCz1. The distance along the third direction between the semiconductor member 10 and the source interconnect portion 23L is taken as the distance dLsz. The distance dCz1 is longer than the distance dLsz. The drain-source capacitance Cds can be small.

In the example, the gate interconnect portion 22L and the drain interconnect portion 21L (or the drain conductive portion 21C) are in the same layer. For example, the direction from the gate interconnect portion 22L toward the drain interconnect portion 21L (or the drain conductive portion 21C) is aligned with the first direction (the Y-axis direction).

FIG. 10A to FIG. 10D are schematic plan views illustrating semiconductor devices according to the second embodiment.

These drawings illustrate planar configurations of the drain conductive portion 21C.

Figure 10A:
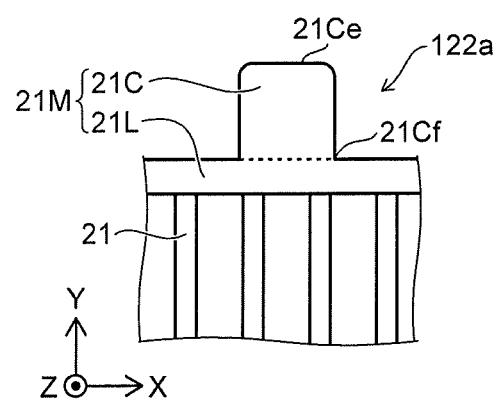
FIG. 10A to FIG. 10D are schematic plan views illustrating semiconductor devices according to the second embodiment.

In a semiconductor device 122a illustrated in FIG. 10A, the planar configuration of the drain conductive portion 21C is substantially a rectangle.

Figure 10B:
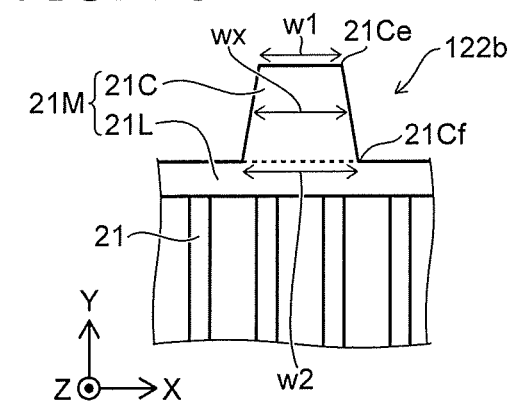

In a semiconductor device 122b illustrated in FIG. 10B, the planar configuration of the drain conductive portion 21C is substantially a trapezoid.

Figure 10C:
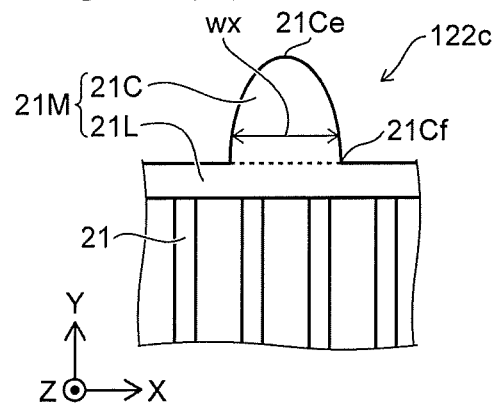

In a semiconductor device 122c illustrated in FIG. 10C, the planar configuration of the drain conductive portion 21C is substantially a portion of a flattened circle.

Figure 10D:
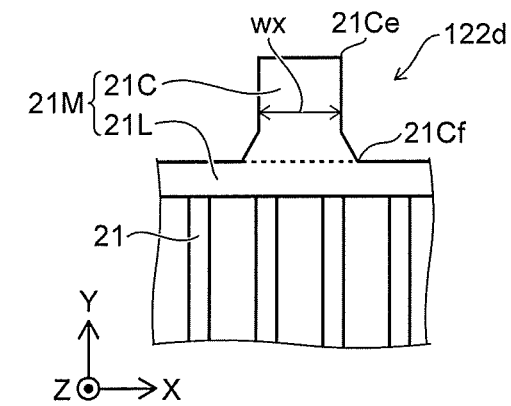

In a semiconductor device 122d illustrated in FIG. 10D, the planar configuration of the drain conductive portion 21C is a combination of a rectangle and a trapezoid.

For example, as shown in FIG. 10B, the drain conductive portion 21C includes a first portion 21Ce and a second portion 21Cf. The second portion 21Cf is between the first portion 21Ce and the drain interconnect portion 21L in the first direction (the Y-axis direction). The first portion 21Ce is an end portion.

A length wx (the width) along the second direction (e.g., the X-axis direction) of the drain conductive portion 21C increases in the orientation from the first portion 21Ce toward the drain interconnect portion 21L.

For example, a length w2 (the width) along the second direction (e.g., the X-axis direction) of the second portion 21Cf is longer than a length w1 (the width) along the second direction of the first portion 21Ce. Because the width of the second portion 21Cf is wide, the concentration of the current can be suppressed. For example, the temperature increase can be suppressed. For example, breakdown at the end portion does not occur easily. For example, higher reliability is obtained easily.

It is favorable for the length in the X-axis direction of the drain conductive portion 21C to be 50 μm or more. It is favorable for the length in the Y-axis direction of the drain conductive portion 21C to be 50 μm or more. By setting the size of the drain conductive portion 21C to be large, the connection is easy when using the drain conductive portion 21C as a pad electrode. It is favorable for the length in the X-axis direction of the drain conductive portion 21C to be not more than 150 μm. It is favorable for the length in the Y-axis direction of the drain conductive portion 21C to be not more than 150 μm. By setting the size of the drain conductive portion 21C to be small, for example, the drain-source capacitance Cds can be small.

Figure 11A:
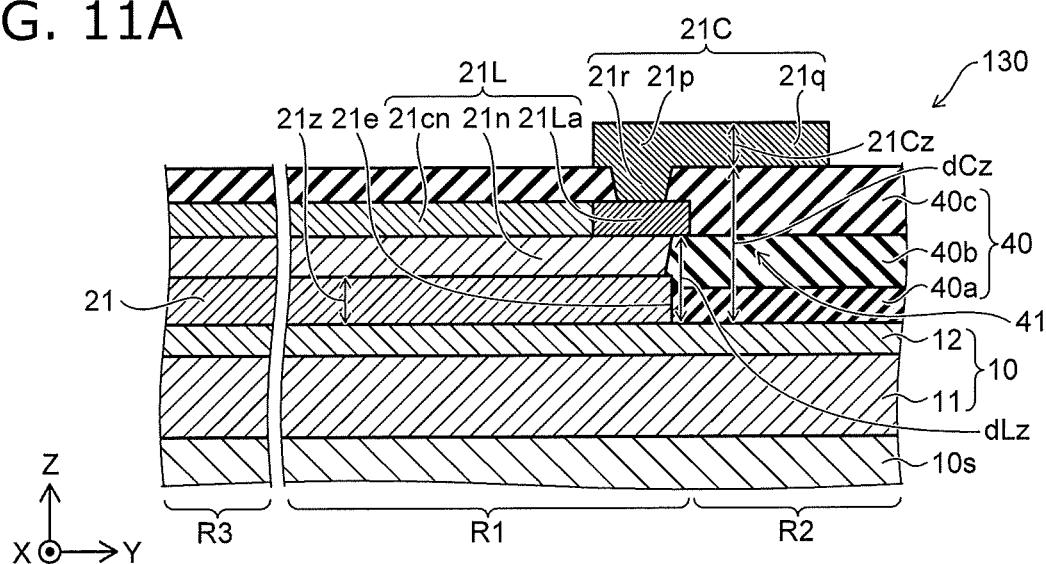
FIG. 11A and FIG. 11B are schematic cross-sectional views illustrating a semiconductor device according to an embodiment.
Figure 11B:
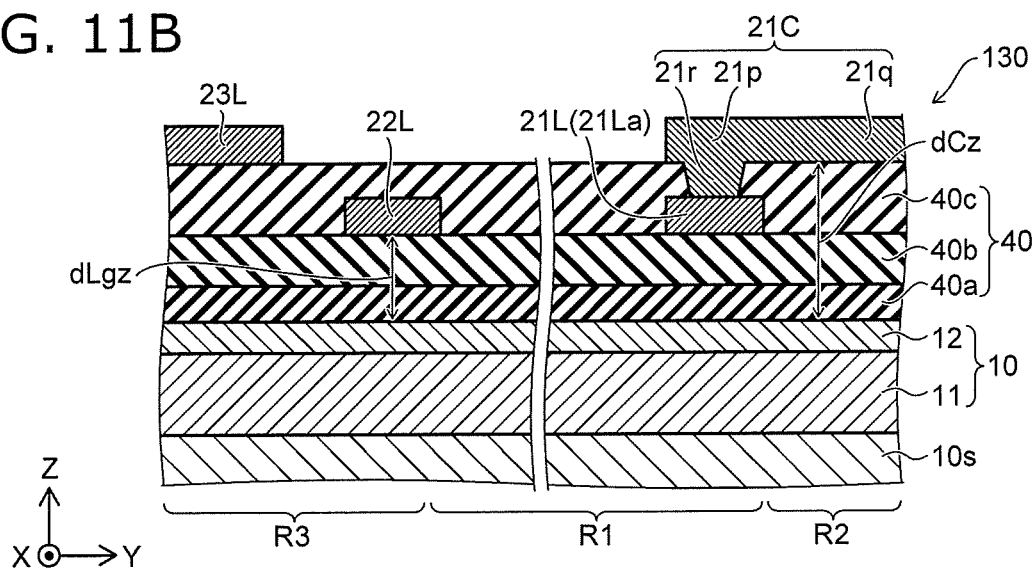

FIG. 11A and FIG. 11B are schematic cross-sectional views illustrating a semiconductor device according to an embodiment.

FIG. 11A and FIG. 11B correspond to FIG. 1A and FIG. 1B, respectively. As shown in FIG. 11A, in a semiconductor device 130, a conductive layer 21cn is provided on a conductive layer for the drain conductive portion 21C. For example, the conductive layer 21cn and the conductive layer for the drain conductive portion 21C may be provided above at least one of the drain electrodes 21. For example, the conductive layer 21cn includes a material included in the second-direction extension portion 21La. For example, the conductive layer for the drain conductive portion 21C includes a material included in the connection portion 21n. By providing the conductive layer 21cn and the conductive layer for the drain conductive portion 21C, the resistance of the drain electrodes 21 can be decreased and a low ON-resistance can be obtained, for example.

According to the embodiments, a semiconductor device can be provided in which the loss can be suppressed.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as semiconductor members, electrodes, interconnection portions, conductive portions, insulating portions, substrates, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such embodiments or modifications as would fall within the scope and spirit of the invention.

What is claimed is:

1. A semiconductor device, comprising:
   a semiconductor member including a first semiconductor region and a second semiconductor region;

a plurality of drain electrodes extending along a first direction, being arranged in a second direction crossing the first direction, and being provided at the first semiconductor region, a direction from the first semiconductor region toward the second semiconductor region being aligned with the first direction;

a drain interconnect portion extending along the second direction and being electrically connected to the plurality of drain electrodes; and a drain conductive portion electrically connected to the drain interconnect portion, the drain conductive portion including a first conductive region and a second conductive region, a portion of the drain interconnect portion being between the first conductive region and the first semiconductor region in a third direction, the third direction crossing a plane including the first direction and the second direction, a direction from the second semiconductor region toward the second conductive region being aligned with the third direction.

2. The device according to claim 1, wherein end portions of the plurality of drain electrodes are between the drain interconnect portion and the first semiconductor region in the third direction.

3. The device according to claim 1, further comprising an insulating portion including an insulating region provided between the second semiconductor region and the second conductive region in the third direction,
the insulating region contacting the second semiconductor region and the second conductive region.

4. The device according to claim 1, wherein
the drain conductive portion further includes a third conductive region, and
the third conductive region is provided between the first conductive region and the drain interconnect portion and electrically connects the first conductive region to the drain interconnect portion.

5. The device according to claim 1, wherein
the drain interconnect portion includes:
a second-direction extension portion extending along the second direction; and
a connection portion electrically connecting the second-direction extension portion and one of the plurality of drain electrodes.

6. The device according to claim 5, wherein a distance along the third direction between the semiconductor member and the second conductive region is longer than a distance along the third direction between the semiconductor member and the second-direction extension portion.

7. The device according to claim 5, further comprising:
a plurality of source electrodes extending along the first direction and being provided at the first semiconductor region;
a source interconnect portion extending along the second direction and being electrically connected to the plurality of source electrodes; and
a gate conductive member electrically connected to one of a plurality of gate electrodes,
the one of the plurality of gate electrodes being between one of the plurality of source electrodes and the one of the plurality of drain electrodes,
a position in the second direction of an end portion of the gate conductive member being between a position in the second direction of the one of the plurality of gate electrodes and a position in the second direction of the one of the plurality of drain electrodes,
a distance along the third direction between the semiconductor member and the drain conductive portion being substantially the same as a distance along the third direction between the semiconductor member and the gate conductive member.

8. The device according to claim 1, further comprising:
a plurality of gate electrodes extending along the first direction and being provided at the first semiconductor region; and
a gate interconnect portion extending along the second direction and being electrically connected to the plurality of gate electrodes,
one of the plurality of gate electrodes being between one of the plurality of drain electrodes and an other one of the plurality of drain electrodes,
a distance along the third direction between the semiconductor member and the second conductive region being longer than a distance along the third direction between the semiconductor member and the gate interconnect portion.

9. The device according to claim 8, wherein
the semiconductor member further includes a third semiconductor region,
the first semiconductor region is provided between the third semiconductor region and the second semiconductor region, and
a direction from the third semiconductor region toward the gate interconnect portion is aligned with the third direction.

10. The device according to claim 8, further comprising:
a plurality of source electrodes extending along the first direction and being provided at the first semiconductor region; and
a source interconnect portion extending along the second direction and being electrically connected to the plurality of source electrodes,
the one of the plurality of gate electrodes being between one of the plurality of source electrodes and the one of the plurality of drain electrodes,
a direction from the source interconnect portion toward the drain conductive portion being aligned with the first direction.

11. The device according to claim 1, further comprising:
a plurality of source electrodes extending along the first direction and being provided at the first semiconductor region; and
a source interconnect portion extending along the second direction and being electrically connected to the plurality of source electrodes,
one of the plurality of source electrodes being between one of the plurality of drain electrodes and an other one of the plurality of drain electrodes,
a distance along the third direction between the semiconductor member and the second conductive region being longer than a distance along the third direction between the semiconductor member and the source interconnect portion.

12. The device according to claim 11, wherein
the semiconductor member further includes a third semiconductor region,
the first semiconductor region is provided between the third semiconductor region and the second semiconductor region, and
a direction from the third semiconductor region toward the source interconnect portion is aligned with the third direction.

13. The device according to claim 1, wherein the drain interconnect portion is not between the second semiconductor region and the second conductive region in the third direction.

14. The device according to claim 1, wherein
a plurality of the drain conductive portions is provided, and
a product of a number of the plurality of drain conductive portions, a length along the third direction of the second conductive region, and a length along the second direction of one of the plurality of drain conductive portions is not less than 0.5 times and not more than 2 times a product of a number of the plurality of drain electrodes, a length along the third direction of one of the plurality of drain electrodes, and a length along the second direction of the one of the plurality of drain electrodes.

15. The device according to claim 1, wherein
a plurality of the drain conductive portions is provided, and
a number of the plurality of drain electrodes is not less than 4 times and not more than 20 times a number of the plurality of drain conductive portions.

16. A semiconductor device, comprising:
a semiconductor member including a first semiconductor region and a second semiconductor region;
a plurality of drain electrodes extending along a first direction, being arranged in a second direction crossing the first direction, and being provided at the first semiconductor region, a direction from the first semiconductor region toward the second semiconductor region being aligned with the first direction; and
a drain conductive member including a drain interconnect portion and a drain conductive portion, the drain interconnect portion extending along the second direction and being electrically connected to the plurality of drain electrodes, a direction from a portion of the plurality of drain electrodes toward the drain interconnect portion being aligned with a third direction, the third direction crossing a plane including the first direction and the second direction, the drain conductive portion being continuous with the drain interconnect portion, a direction from the second semiconductor region toward the drain conductive portion being aligned with the third direction.

17. The device according to claim 16, wherein a length along the second direction of the drain interconnect portion is longer than a length along the first direction of the drain conductive portion.

18. The device according to claim 16, wherein
the drain conductive portion includes a first portion and a second portion,
the second portion is between the first portion and the drain interconnect portion in the first direction, and
a length along the second direction of the second portion is longer than a length along the second direction of the first portion.

19. The device according to claim 16, wherein
the drain conductive portion includes a first portion and a second portion,
the second portion is between the first portion and the drain interconnect portion in the first direction, and
a length along the second direction of the drain conductive portion increases in an orientation from the first portion toward the drain interconnect portion.

20. The device according to claim 16, wherein a direction from the drain interconnect portion toward the drain conductive portion is aligned with the first direction.

* * * * *